US 8,594,169 B2

(12) United States Patent
Zivny et al.

(10) Patent No.: US 8,594,169 B2
(45) Date of Patent: Nov. 26, 2013

(54) METHOD FOR DECOMPOSING AND ANALYZING JITTER USING SPECTRAL ANALYSIS AND TIME-DOMAIN PROBABILITY DENSITY

(75) Inventors: Pavel Zivny, Portland, OR (US); Mark L. Guenther, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 351 days.

(21) Appl. No.: 13/081,369

(22) Filed: Apr. 6, 2011

(65) Prior Publication Data

US 2011/0292987 A1    Dec. 1, 2011

Related U.S. Application Data

(60) Provisional application No. 61/349,149, filed on May 27, 2010.

(51) Int. Cl.
*H04B 17/00* (2006.01)
(52) U.S. Cl.
USPC ............................. 375/226; 375/224; 375/228
(58) Field of Classification Search
USPC ......... 375/224, 348, 346, 286, 226, 228, 229, 375/371; 702/69, 77, 190, 191
See application file for complete search history.

(56) References Cited

U.S. PATENT DOCUMENTS

| | | | |
|---|---|---|---|
| 6,832,172 B2 | 12/2004 | Ward et al. | |
| 6,898,535 B2 * | 5/2005 | Draving | 702/69 |
| 7,254,168 B2 | 8/2007 | Guenther | |
| 7,388,937 B1 * | 6/2008 | Rodger et al. | 375/348 |
| 7,400,988 B2 * | 7/2008 | Tabatabaei | 702/69 |
| 7,623,977 B2 * | 11/2009 | Tabatabaei | 702/69 |
| 7,899,638 B2 | 3/2011 | Miller | |
| 7,941,287 B2 * | 5/2011 | Tabatabaei | 702/69 |
| 8,065,141 B2 * | 11/2011 | Maeda | 704/219 |
| 2004/0136450 A1 * | 7/2004 | Guenther | 375/226 |
| 2008/0319691 A1 * | 12/2008 | Tabatabaei | 702/69 |

OTHER PUBLICATIONS

Agilent Technologies (Analyzing Jitter Using, Application Note 1563, Agilent EZJIT Plus Software, Inc. 2008 Printed in USA, Sep. 15, 2008 5989-3776EN, pp. 1-20).*
LeCroy WaveMaster 8 Zi-A Series, Oct. 14, 2010.

* cited by examiner

*Primary Examiner* — Shuwang Liu
*Assistant Examiner* — Helene Tayong
(74) *Attorney, Agent, or Firm* — Marger Johnson & McCollom PC; Thomas F. Lenihan (57) ABSTRACT

A method for analyzing jitter using a test and measurement instrument includes obtaining a collection of time interval error (TIE) values corresponding to composite jitter of a waveform, optionally decomposing the composite jitter into jitter components that are correlated to the data pattern and components that are uncorrelated to the data pattern, and using a spectral approach to decompose the jitter components into jitter components that are recognizable as deterministic and jitter components that are unrecognizable as deterministic. Thereafter, the jitter components analyzed in the frequency domain are converted back to the time domain, and subtracted from the composite jitter, thereby isolating uncorrelated residual jitter. The uncorrelated residual jitter is decomposed into bounded uncorrelated jitter and random jitter, for example, by integrating a probability density (PDF) function of the residual jitter and analyzing the resulting cumulative distribution function (CDF) curve in Q-space.

28 Claims, 8 Drawing Sheets

METHOD FOR DECOMPOSING AND ANALYZING JITTER USING SPECTRAL ANALYSIS AND TIME-DOMAIN PROBABILITY DENSITY

CROSS REFERENCE TO RELATED APPLICATION

This application claims the benefit of provisional patent application Ser. No. 61/349,149, filed May 27, 2010, herein incorporated by reference.

BACKGROUND

Jitter and noise are commonly known among electrical engineers and similar specialists to cause signal quality problems in high-frequency signals. In general, jitter can be thought of as the "horizontal" displacement of various aspects of pulses in a high-frequency signal or waveform, and noise can be thought of as the "vertical" displacement. Various types of sources can contribute to the overall jitter and noise of a signal such as by electromagnetic interference, crosstalk, data dependent effects, random sources, and so forth. The impact of jitter or noise on a signal can be detrimental to signal quality, particularly in high-frequency systems. As a result, engineers and other designers are mindful of these effects, which can often dictate the design approach for circuit elements, the kind and quality of communication links used in a particular system, the frequency by which signals are transmitted, among other considerations.

Jitter can be decomposed into components to aid in the analysis of the total jitter of a system using a test and measurement instrument such as an oscilloscope. Conventional approaches for decomposing jitter include separating deterministic jitter (DJ) from random jitter (RJ), and then "reassembling" or convolving the jitter components for analysis of the total jitter at a specific bit error rate (BER), sometimes referred to as TJ@BER. During the separation of DJ from the RJ, certain unrecognized periodic and/or aperiodic bounded jitter components may be erroneously included in the RJ. Such mis-qualification is pernicious to any attempts to extrapolate the total jitter amount, since the random component is typically greatly multiplied to calculate TJ@BER. In other words, the exaggerated RJ results in a greatly exaggerated estimation of total jitter of the system.

Relatively recently, the art of jitter analysis has embraced a methodology that plots jitter histograms on a "Q-scale" and uses the asymptotic behavior of the plot to infer the sigma value for the RJ. Known disclosures of this method, for example as specified in the PCI Express Gen 3 standard, apply it to the composite or aggregate jitter or to jitter from which a data-dependent component has been removed. In these applications, any periodic jitter has not been first removed by spectral analysis or other methods. However, the presence of periodic jitter in the distribution can bias the RJ sigma thus inferred, and therefore yield a total jitter calculation of lesser accuracy than would otherwise be obtainable.

Such limitations prevent users of the oscilloscope or other test and measurement instrument from accurately estimating the total jitter of a waveform. Without more precise measurements, it is difficult or impossible to diagnose the source of the jitter, let alone design a system for preventing the jitter from interfering with the quality and integrity of the signal. It would be desirable to more accurately estimate the random jitter, and therefore, the total jitter of a signal so that signal quality can be improved.

Accordingly, a need remains for methods and systems for isolating and analyzing jitter components using spectral analysis and time-domain probability density.

DETAILED DESCRIPTION

Reference is made herein to a test and measurement instrument. The test and measurement instrument can implement or include various example embodiments of the present invention, which can be applied in a variety of ways and to a variety of different applications, including for example, the measurement and analysis of jitter associated with digital or analog signals. The signals can be associated with, for example, high-frequency wired or wireless communication systems, high-speed memory or other logic circuits, storage devices, networks, and so forth. The test and measurement instrument as described herein can be used for precision decomposing, convolving, and/or analyzing the jitter of a signal.

The term "jitter" as used herein refers to the "horizontal" displacement of various aspects of pulses of a signal or waveform, such as for example the displacement of the pulses within the time domain, phase timing, or the width of the pulses themselves. The term "noise" as used herein refers to the "vertical" displacement of various aspects of pulses of a signal or waveform, such as for example amplitude error in the signal or other vertical noise effects. While the inventive techniques disclosed herein are generally discussed in the context of "jitter" rather than "noise," any of the embodiments of the invention disclosed herein can be used to decompose, isolate, convolve, and/or analyze either jitter or noise, or both, associated with a signal or waveform.

Figure 1:
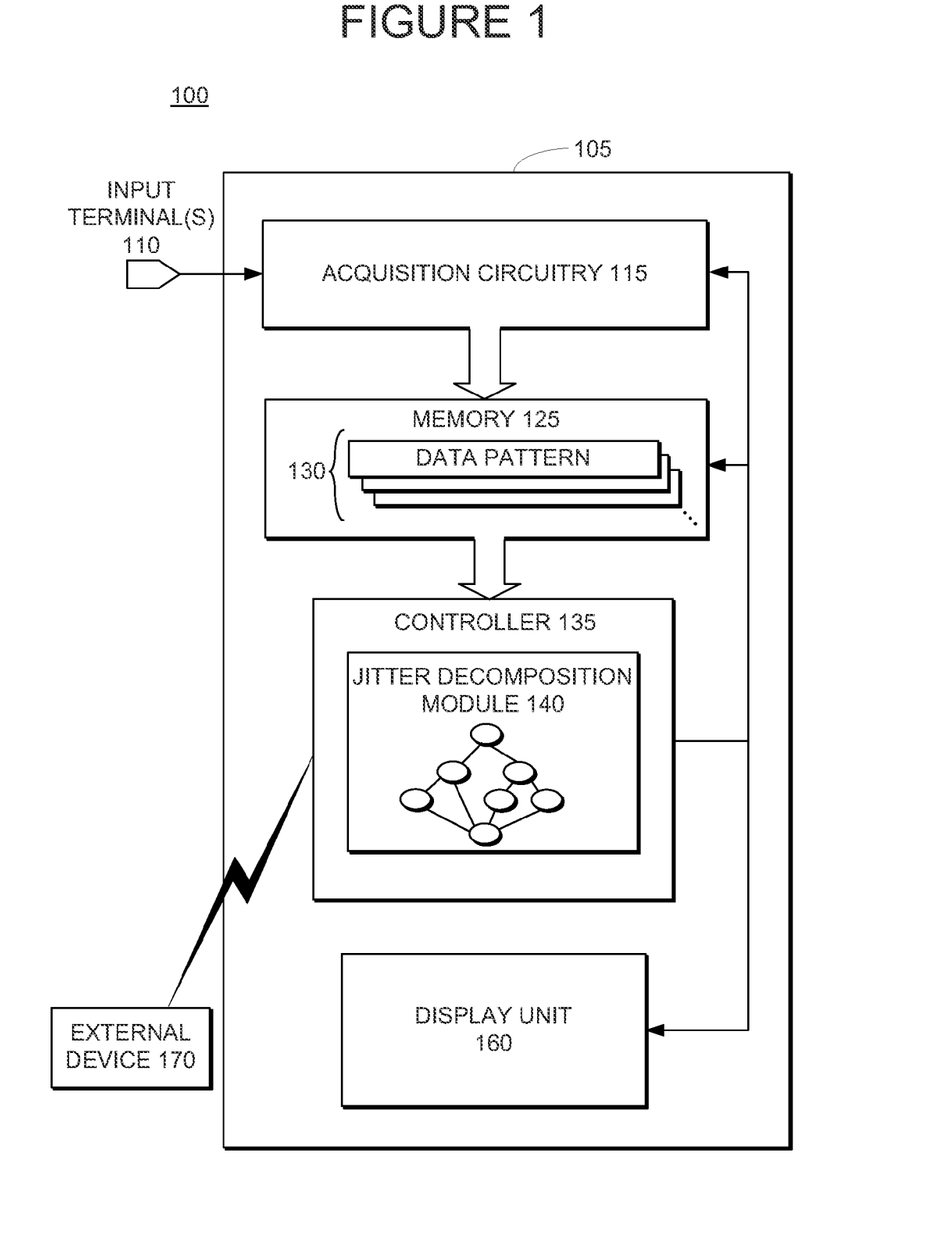
FIG. 1 illustrates a simplified block diagram of one embodiment of a test and measurement instrument, including a jitter decomposition module, according to embodiments of the present invention.

FIG. 1 illustrates a simplified block diagram 100 of one embodiment of a test and measurement instrument 105, including a jitter decomposition module 140, according to embodiments of the present invention. The test and measurement instrument 105 will generally be referred to herein as oscilloscope 105, although it should be understood that the test and measurement instrument 105 can be a spectrum analyzer, a signal analyzer, etc., among other suitable test and measurement instruments. The oscilloscope 105 can include, for example, one or more input terminals 110, acquisition circuitry 115, memory 125, a controller 135 including a jitter decomposition module 140, and a display unit 150, according to some embodiments of the present invention. The controller 135, and more specifically the jitter decomposition module 140, alone or in combination with other components of the oscilloscope 105, can implement or cause to be implemented any of the various embodiments of the invention as disclosed herein.

The oscilloscope 105 may have one, two, four, or any number of channels or inputs 110, suitable for use with various embodiments as described herein. While components of the oscilloscope 105 are shown to be directly coupled to each other, it should be understood that the oscilloscope 105 can include a variety of other circuit or software components, inputs, outputs, and/or interfaces, which are not necessarily shown, but that are disposed between or otherwise associated with the illustrated components of oscilloscope 105.

One or more waveforms or electrical signals under test are received at the input terminals 110. Acquisition circuitry 115 acquires and digitizes the signals. The digitized signals are stored in memory 125. The digitized signals can include one or more data patterns 130. Memory 125 can be any suitable recordable medium or storage medium capable of storing the one or more data patterns 130. The memory can also store one or more time interval error (TIE) values (not shown) for comparison with the one or more data patterns 130. Alternatively, the TIE values can be stored in a recordable medium separate from the memory 125.

A controller 135 is operatively coupled to the memory 125 and the display unit 150. The controller 135 processes the waveforms or signals under test, and produces corresponding jitter distributions, histograms, probability density function curves, cumulative distribution function curves, Q-space plots, traces, and/or other jitter measurements, any of which may be displayed by the display unit 150. The controller includes jitter decomposition module 140, the operation of which is described more fully below. Any of the components of the controller 135 and/or the jitter decomposition module 140 may exist in or be implemented using hardware, software, firmware, or by any combination thereof In some embodiments, the controller 135 can communicate jitter information with external device 145 via a conductor such as a bus or a wire. The external device 145 can include, for example, a computer separate from the oscilloscope 105, or an external memory device, among other possibilities. Alternatively, or in addition to, the controller 135 can transmit information about a jitter analysis of the signal or waveform to the external device 145, and/or receive information from the external device 145 to enhance the jitter analysis performed using the oscilloscope 105.

Figure 2A:
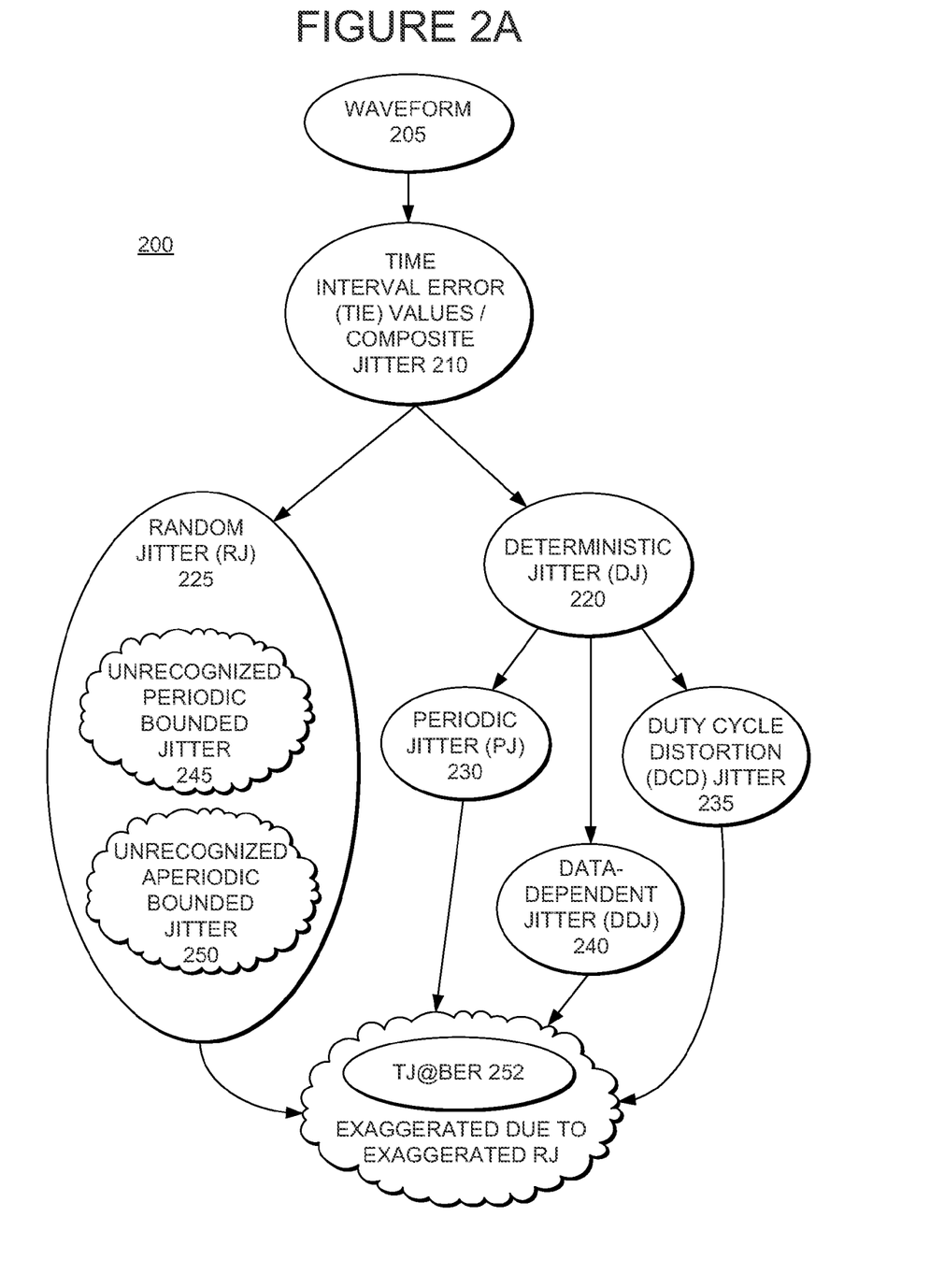
FIG. 2A illustrates a diagram showing the decomposition of jitter components of a waveform, and the mis-qualification of certain unrecognized bounded jitter elements as random jitter.

FIG. 2A illustrates a diagram 200 showing the decomposition of jitter components of a waveform, and the mis-qualification of certain unrecognized bounded jitter elements 245, 250 as random jitter 225. After acquiring a waveform 205, edge locations of the data patterns (e.g., 130 of FIG. 1) associated with the waveform can be identified and analyzed, and an ordered list of time tags generated based on the data patterns. The edge locations can then be compared to a timing reference. More specifically, the controller (e.g., 135) can cause the ordered list of time tags to be compared to a list of time tags representing a jitter-free version of the same data stream that was acquired. Such comparison yields an ordered list of time-interval error tags, referred to herein as TIE values 210. The TIE values essentially correspond to the composite or aggregate jitter 210 associated with the acquired waveform.

After determining the composite jitter, a separation technique can be used to separate deterministic jitter (DJ) 220 from random jitter (RJ) 225. The deterministic jitter 220 can be further divided into periodic jitter (PJ) 230, data dependent jitter (DDJ) 240, and/or duty cycle distortion (DCD) jitter 235. Techniques for separating the DJ 220 into its constituent components PJ 230, DDJ 240, and/or DCD 235 (among other possible deterministic jitter components such as sub-harmonic jitter) are known in the art and not of central importance to the various embodiments of the present invention.

Random jitter is generally understood among persons having skill in the art to possess a Gaussian probability distribution and a relatively broad frequency content. In contrast, deterministic jitter is understood to possess a bounded probability distribution and usually exhibits a repetitive characteristic in the time domain. It is recognized among those with skill in the art that these properties offer a means of separating RJ from other jitter types by converting the time-domain jitter to the frequency (spectral) domain. This method of separation has many desirable and well-understood attributes. For instance, in a spectral analysis, some 'spikes' appear at regular frequency intervals and other spikes appear at apparently random locations. All of the spikes correspond to deterministic jitter, while the remaining spectral "floor" has been assumed to be composed entirely of random jitter with a Gaussian probability distribution. In reality, certain unrecognized bounded jitter components, such as unrecognized periodic bounded jitter 245 and/or unrecognized aperiodic bounded jitter 250, can be lurking in the spectral floor and unknowingly included in the RJ determination. Existing methods for separating the DJ 220 from the RJ 225 are ineffective in discerning the presence of these unrecognized jitter elements. In a traditional analysis, all of these components, since they are indistinguishable in the frequency domain, are classified as 'random' jitter (and therefore assumed to possess an unbounded Gaussian probability density function).

As an example, jitter due to crosstalk may be non-periodic, uncorrelated with the data pattern, and possessing a bounded probability distribution, yet can be unsuspectingly grouped together with the RJ 225. The consequence of mistaking a bounded jitter source for an unbounded source is particularly severe when the jitter model is used to extrapolate performance of the communications link at low bit error rates. Moreover, the exaggeration of the RJ 225 results in an exaggeration of the total jitter at a given bit error rate (BER), otherwise referred to herein as TJ@BER 252. Such misqualification is pernicious to any attempts to extrapolate the total jitter amount because the random component is typically greatly multiplied to calculate TJ@BER 252.

Figure 2B:
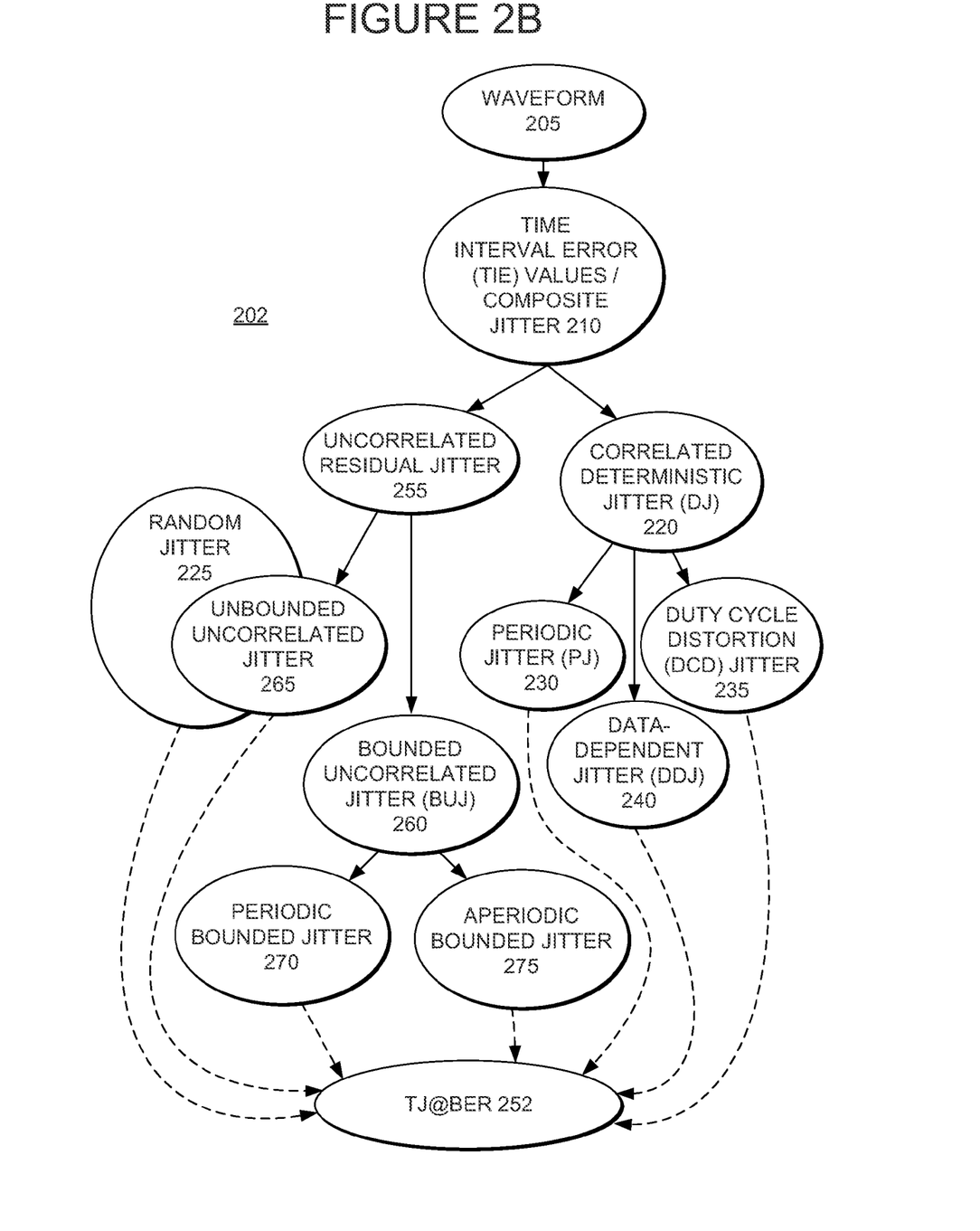
FIG. 2B illustrates a diagram showing the decomposition and recombination of jitter components of a waveform according to some example embodiments of the present invention.

FIG. 2B illustrates a diagram 202 showing the decomposition and recombination of jitter components of a waveform 205 according to some example embodiments of the present invention. As described above, an ordered list of time-interval error tags, referred to herein as time interval error (TIE) values 210 are obtained. The TIE values essentially correspond to the composite or aggregate jitter 210 associated with the acquired waveform, which is generally referred to herein as 'composite' jitter 210.

Diagram 202 of FIG. 2B provides a high-level diagram of the decomposition of the jitter. More specific inventive techniques for decomposing the composite jitter 210 into various jitter components and analyzing the same are more fully described with reference to FIGS. 3A-3D and 4A-4C below. In general, the composite jitter 210 is decomposed into correlated deterministic jitter 220 and uncorrelated residual jitter 255 using a spectral jitter separation technique optionally combined with a data pattern correlation technique. The correlated deterministic jitter 220 is further decomposed into PJ 230, DDJ 240, and/or DCD 235 as described above.

The uncorrelated residual jitter 255 is further decomposed into bounded uncorrelated jitter (BUJ) 260 and unbounded uncorrelated jitter 265. The unbounded uncorrelated jitter 265 can be (although need not be) represented as RJ 225 with a Gaussian probability density function. The BUJ 260 can include components such as periodic bounded jitter components 270 that were not previously separated as PJ 230, and aperiodic bounded jitter 275. The aperiodic bounded jitter 275 may have unclear, spread, or wide spectral distribution, and might also be referred to as wide spectrum jitter or smeared spectrum jitter. Such bounded uncorrelated jitter 260 can be a result of, for example, cross-talk or other signal interference and/or anomalies.

After having decomposed the uncorrelated residual jitter 255 into BUJ 260 and unbounded uncorrelated jitter 265, the total jitter calculation can now be based on the much more stable and less cluttered BUJ decomposition. Moreover, overestimation of the total jitter due to errors in finding the periodicity of PJ or errors in identifying other bounded but non-deterministic effects is greatly reduced.

FIGS. 3A-3D illustrate a flow diagram 300 for decomposing, convolving, and analyzing jitter according to an example embodiment of the present invention. The process flow begins at 305, where a signal or waveform is received by an input of the oscilloscope 105. At 310, one or more data patterns associated with the waveform are stored in an acquisition memory. Edge locations of the data patterns associated with the waveform can be identified and analyzed at 315, and compared to a timing reference at 320. As a result, a collection of TIE values is obtained at 325, which correspond to the composite jitter of the waveform 305.

Figure 3A:
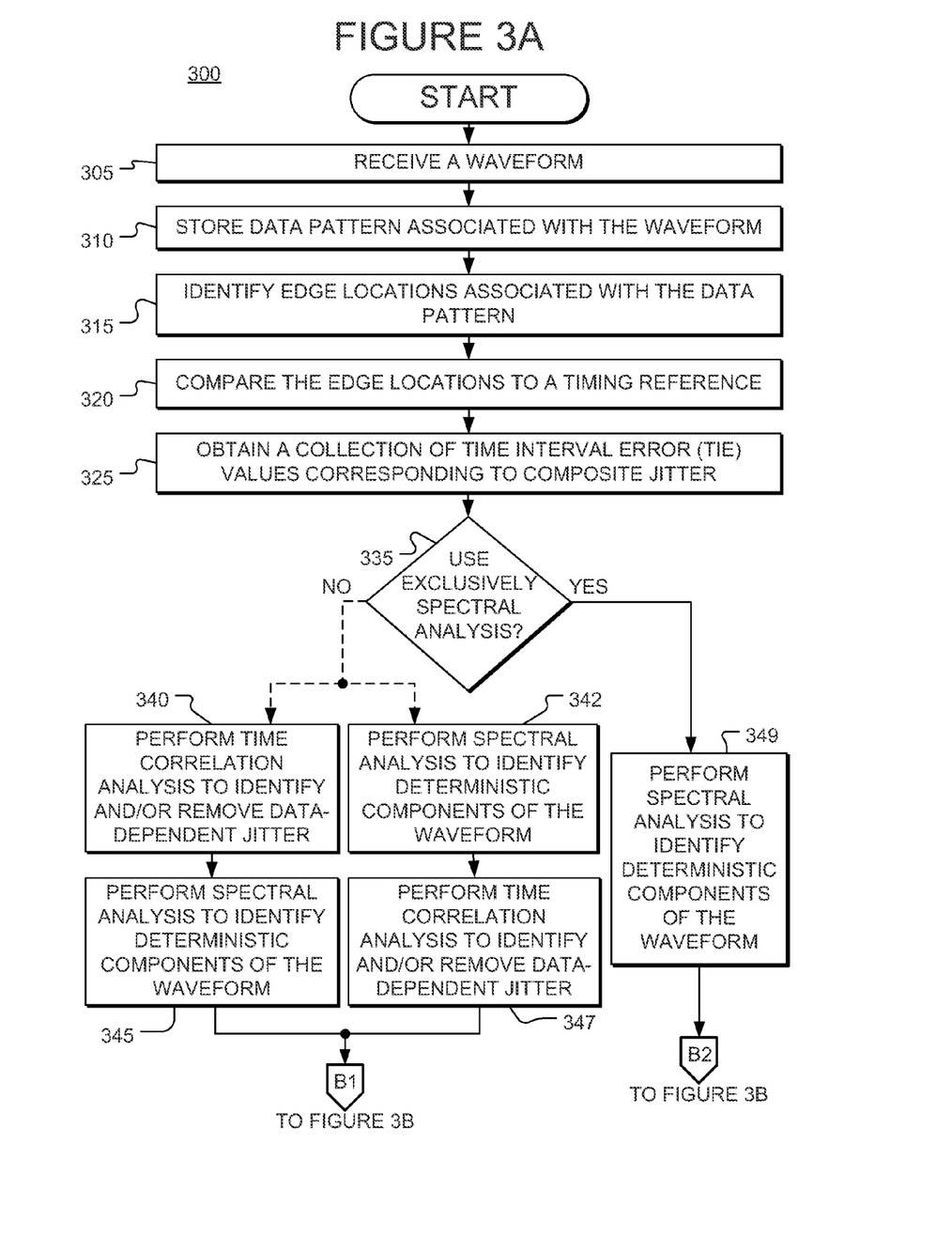
FIGS. 3A-3D illustrate a flow diagram for decomposing, convolving, and analyzing jitter according to an example embodiment of the present invention.

The flow then proceeds to 335 where a decision is made whether the deterministic jitter will be separated using exclusively a spectral analysis technique, or a spectral analysis technique together with other techniques. This decision may be made based on input or guidance received from the operator or user of the oscilloscope, for example, after the operator or user has had the opportunity to analyze the signal. Alternatively, the decision may be made automatically based on a programmatic or automated analysis of the signal. In either case, the decision can be guided at least in part by the fact that, if the data pattern is cyclically repeating with a known pattern length, it is feasible to separate essentially all deterministic jitter using only a spectral technique. Even if the pattern is repeating with known length, it may be desirable to use a spectral analysis technique in combination with other methods, for example when required to comply with an industry standard or due to a preference by the operator, among other reasons. If the pattern is non-repeating, a spectral analysis alone cannot sufficiently isolate the DDJ. In such a case, a combination of the spectral analysis technique and the time correlation technique produces a better result.

Where the decision is made at 335 to exclusively perform a spectral analysis, then the flow proceeds to 349 and a spectral analysis is performed to identify deterministic components of the signal or waveform. Otherwise, if the decision is made at 335 not to exclusively perform a spectral analysis, then the flow proceeds along one of two paths. In a preferred embodiment, a first path involves a time correlation analysis to identify and possibly remove data-dependent jitter, which is performed at 340, followed by a spectral analysis to identify further deterministic components of the waveform, which is performed at 345. Alternatively, a second path performs the spectral analysis at 342 followed by the time correlation analysis at 347.

The time correlation analysis technique performed at either 340 or 347 is used to identify DDJ. Optionally, it may also remove such identified DDJ (or equivalently, produce a modified ordered list of time tags representing the composite jitter absent the DDJ). For instance, if a bit pattern such as "00101101" is observed many times, and a histogram of the TIE on the final edge (e.g., "01") is created, then the mean value of that histogram can reveal the best expected value for TIE due to that bit pattern. To a large extent, variation or spread that can be present in the histogram is due to RJ or other jitter sources that are not correlated to the data pattern. This example is illustrative of one method for finding DDJ using time correlation; it should be understood that other similar methods can be used, for example depending on whether the data represents a cyclically-repeating pattern.

The spectral analysis technique performed at 345, 342, and/or 349 is to further identify deterministic components of the waveform 345, which are not necessarily correlated to the data pattern itself In other words, using a spectral approach, jitter components that are uncorrelated to the data pattern can be decomposed into jitter components that are recognizable as periodic and jitter components that are unrecognizable as periodic. In the spectral analysis, the 'spikes' that exceed some (possibly frequency-dependent) threshold are deemed to be deterministic jitter and identified as such. When these spikes appear at frequencies not corresponding to the data rate divided by the repeating pattern length, the spikes are identified to be not correlated to the data pattern. The spectral analysis approach can include decomposing the jitter components using one or more Discrete Fourier Transform (DFT) or Fast Fourier Transform (FFT) calculations, into the jitter components that are recognizable as deterministic and/or periodic and the jitter components that are unrecognizable as deterministic and/or periodic.

After having identified the bounded deterministic jitter components in the waveform using the techniques of 335, 340, 345, 342, 347, and/or 349 the Gaussian component and the aggregate deterministic component of jitter are largely isolated; however, there nevertheless may remain unrecognized individual bounded jitter components that are not otherwise revealed using the modeling techniques and parameters set forth in the flow diagram up to this point. The presence of these bounded components (which typically make up the great majority of the jitter being observed) can bias attempts to accurately measure the standard deviation σ of the relatively small Gaussian components. In other words, the techniques of 335, 340, 345, 342, 347, and/or 349 serve to remove the bounded components DJ 220 (including PJ 230, DDJ 240, and/or DCD 235) before proceeding to decompose the uncorrelated residual jitter 255 into BUJ 260 and unbounded uncorrelated jitter 265. Such is a preparatory step for performing a Q-scale analysis—not on the composite or aggregate jitter 210—but rather, on the uncorrelated residual jitter 255, as further described in detail below.

Figure 3B:
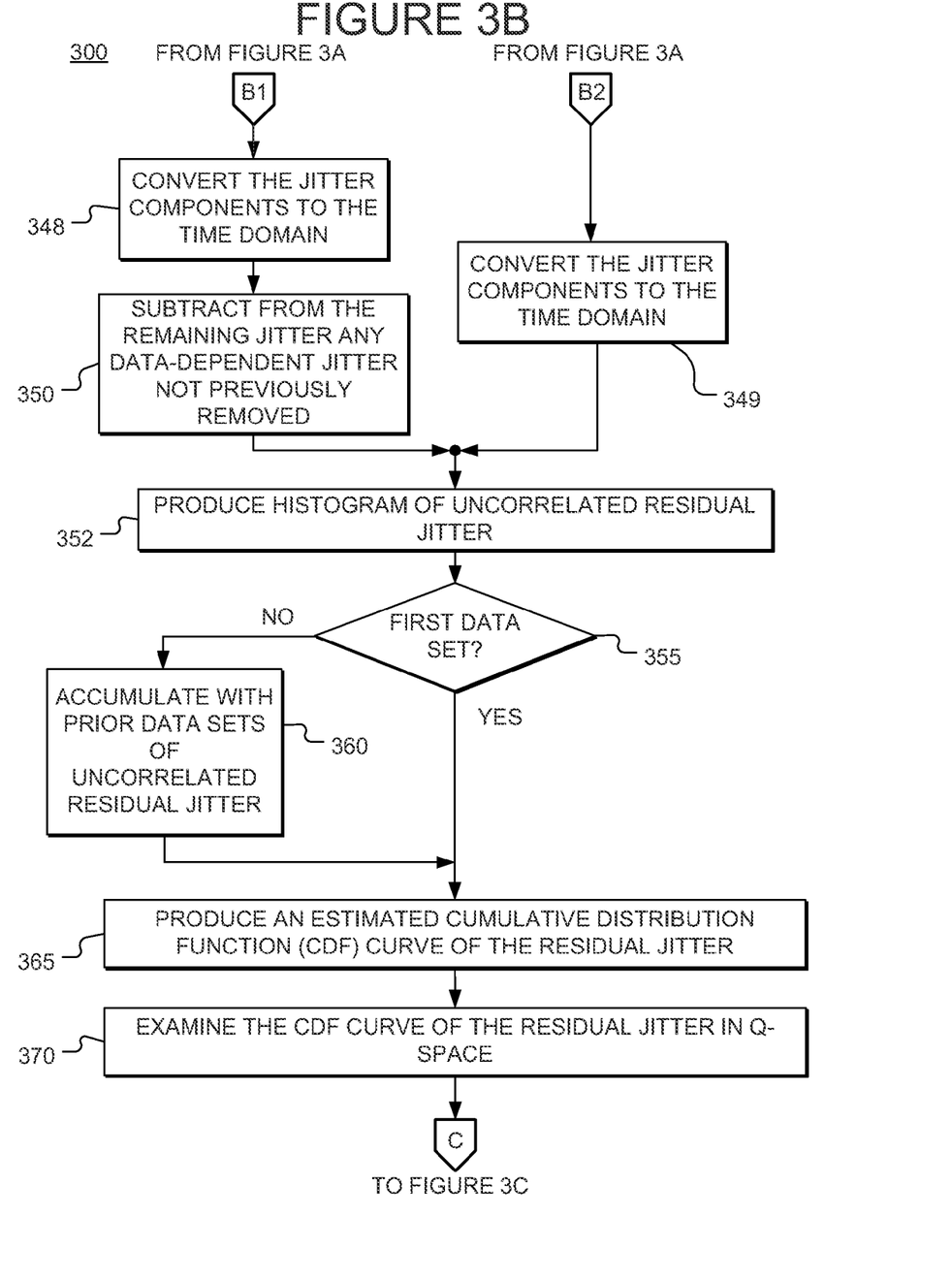

To further isolate the uncorrelated bounded jitter components, the flow proceeds to FIG. 3B through either B1 or B2 depending on the decision at 335 whether to exclusively apply the spectral analysis technique. The path through B1 lead to 348 of FIG. 3B, where any jitter components analyzed using a spectral analysis in the frequency domain are converted back to the time domain. For example, after the recognizably periodic jitter (e.g., PJ 230 of FIG. 2A/2B) is removed using the spectral technique, the remaining spectral jitter components (e.g., unbounded RJ 225, unrecognized periodic bounded jitter 245, and/or unrecognized aperiodic bounded jitter 250) are then transformed into the time domain at 348. At 350, any jitter components that are correlated to the data pattern (e.g., data-dependent jitter such as 235 and 240), which may not have been previously removed at 340 and/or 347, are subtracted from the remaining jitter and/or composite jitter (e.g., 210), thereby isolating uncorrelated residual jitter (e.g., 255). This subtraction can be done, for example, by synthesizing the components, preferably in the time domain, and subtracting the components using the principle of linear superposition. Alternatively, or in addition to, the subtraction can be done by controlled acquisition or processing of only certain edges in the pattern. Thereafter, the flow proceeds to 352, where a histogram of the uncorrelated residual jitter is produced.

Otherwise, where the flows proceeds though B2 to 349 of FIG. 3B, the jitter components are converted to the time domain, after which the flow proceeds directly to 352. In either scenario, once a time-domain representation of the uncorrelated residual jitter is available, a histogram of the uncorrelated residual jitter is produced at 352 of FIG. 3B.

Still referring to FIG. 3B, a determination is made at 355 whether the current set of uncorrelated residual jitter is the first data set. If NO, the flow proceeds to 360 where the current data set is accumulated with prior data sets of uncorrelated residual jitter so that a combined set of uncorrelated residual jitter (e.g., 255) is accumulated. Otherwise, if YES, the flow proceeds to 365, and an estimated cumulative distribution function (CDF) curve of the combined residual jitter is produced. For instance, the estimated CDF can be produced by integrating the histogram of uncorrelated residual jitter. The estimated CDF curve that results is analyzed to separate the BUJ (e.g., 260) from the unbounded uncorrelated jitter (e.g., 265), for example, by examining the CDF curve of the combined uncorrelated residual jitter 255 in the Q-space at step 370. The BUJ can therefore be isolated based on the examination of the CDF curve of the combined residual jitter in Q-space.

The Q-scale is a mathematical transformation of the CDF's probability axis, such that a Gaussian distribution appears as a straight line with a slope inversely related to the standard deviation. Once the estimated CDF is plotted on the Q-scale, straight lines are fitted to the left and right asymptotic regions, for example, according to a minimization criteria, and the slopes of the lines reveal the standard deviation of the Gaussian distributions. Since only the Gaussian random jitter contributes to the unbounded left and right extremes of the PDF, the standard deviation of this random jitter can be estimated by varying the standard deviation of a Gaussian jitter model and comparing the results to the measured distribution. It should be understood that straight lines may be fitted to the asymptotes of the curve by other means, including for example guidance from a user based on visual inspection of the curve.

The PDF/CDF/Q-space analysis of the uncorrelated residual jitter 255 at 370 is performed in a less cluttered environment in the sense that the jitter has been previously distilled into uncorrelated and correlated components, so that the Q-space analysis can further refine the uncorrelated residual jitter and reveal the otherwise unrecognizable periodic bounded jitter 245/270 and/or aperiodic bounded jitter 250/275.

More specifically, the process for decomposing the uncorrelated residual jitter 255 into BUJ 260 and unbounded uncorrelated jitter 265, and isolating the BUJ based on the examination of the CDF curve of the combined residual jitter in Q-space can include the following steps. Reference is now made to FIGS. 4A, 4B, and 4C while simultaneously referencing the remaining flow diagram elements of FIGS. 3C and 3D. FIGS. 4A-4C illustrate various distributions including Gaussian only, composite, and Gaussian with bounded uncorrelated jitter distributions, as further described below.

Figure 3C:
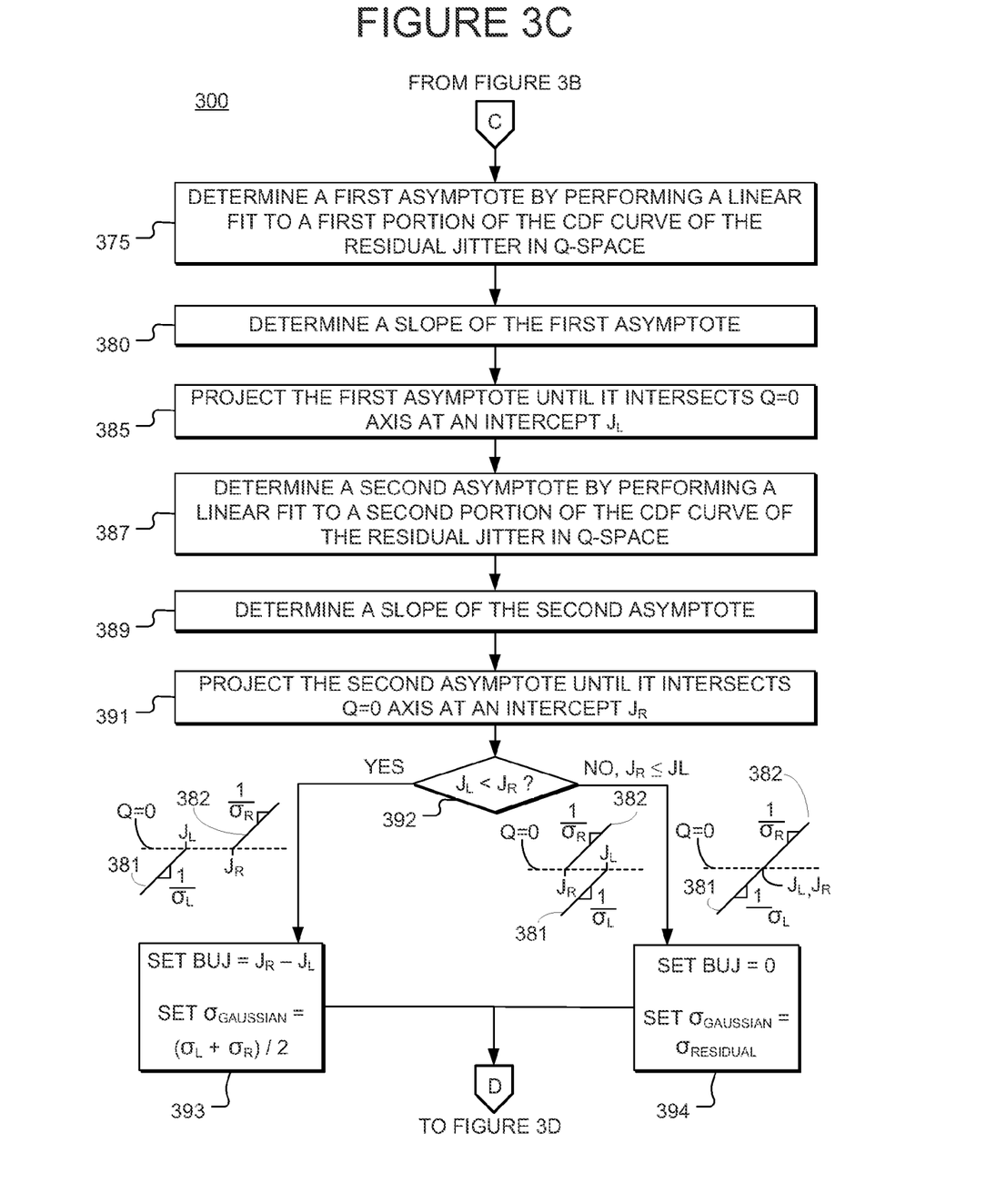
Figure 4A:
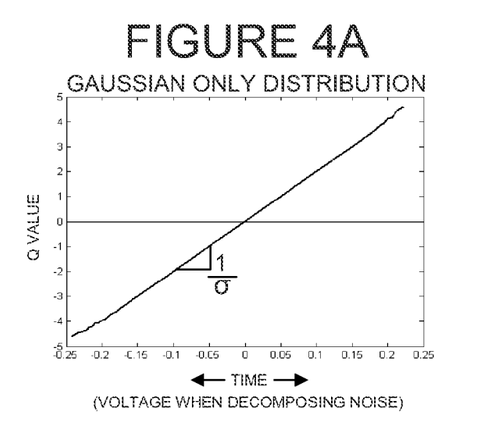
FIGS. 4A-4C illustrate various distributions including Gaussian only, composite, and Gaussian with bounded uncorrelated jitter distributions.
Figure 4B:
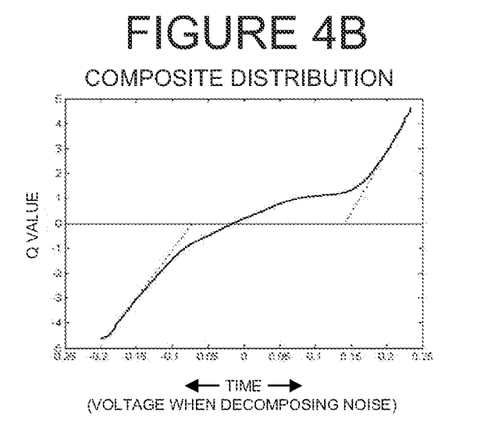
Figure 4C:
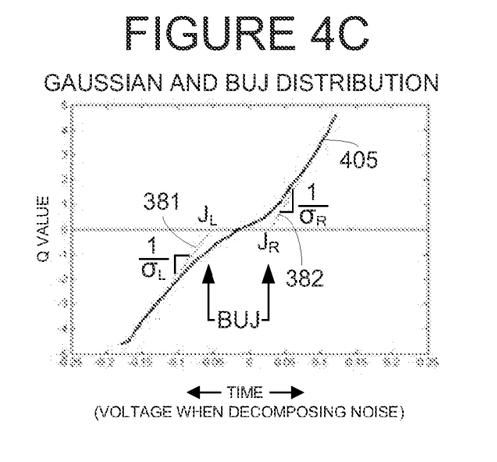

After generating the CDF curve of the combined residual jitter in Q-space at 370, a first asymptote (e.g., 381) is determined at 375 by performing a linear fit to a left portion of the CDF curve 405 (of FIG. 4C) of the combined residual jitter in Q-space, as illustrated in FIGS. 3C and 4C. A slope of the first asymptote 381 is determined at step 380, which is defined as 1 divided by $\sigma_L$ ($1/\sigma_L$). The first asymptote 381 is projected in accordance with the determined slope until it intersects Q=0 axis at an intercept $J_L$ at step 385. A second asymptote (e.g., 382) is determined at 387 by performing a linear fit to a right portion of the CDF curve 405 of the combined residual jitter in Q-space, as illustrated in FIGS. 3C and 4C. A slope of the second asymptote 382 is determined at step 389, which is defined as 1 divided by $\sigma_R$ ($1/\sigma_R$). The second asymptote 382 is projected in accordance with the determined slope until it intersects Q=0 axis at an intercept $J_R$ at step 391.

The BUJ 260 can therefore be isolated based on a comparison of $J_L$ and $J_R$. More specifically, a determination is made at 392 whether $J_L$ is less than $J_R$. If YES, the flow proceeds to 393, and BUJ 260 is set to or otherwise determined to be $J_R$ minus $J_L$ ($J_R$–$J_L$) and the standard deviation of the random jitter (e.g., $\sigma_{GAUSSIAN}$) is set to or otherwise determined to be the mean of $\sigma_L + \sigma_R$, or in other words, ($\sigma_L + \sigma_R$) divided by 2 (($\sigma_L + \sigma_R$)/2). In other words, the residual jitter is modeled as the sum of a Gaussian component and a bounded jitter component.

Otherwise, if NO, then $J_R$ is less than or equal to $J_L$, the flow proceeds to 394, and BUJ 260 is set to or otherwise determined to be zero. A negative value of BUJ has no physical interpretation; usually the value is small if it occurs, and represents noise in the measurement process. In addition, the standard deviation of the random jitter (e.g., $\sigma_{GAUSSIAN}$) is set to or otherwise determined to be the standard deviation of the residual jitter (e.g., $\sigma_{RESIDUAL}$). In other words, the left and right asymptotes are substantially collinear and the random jitter is modeled as entirely Gaussian.

Figure 3D:
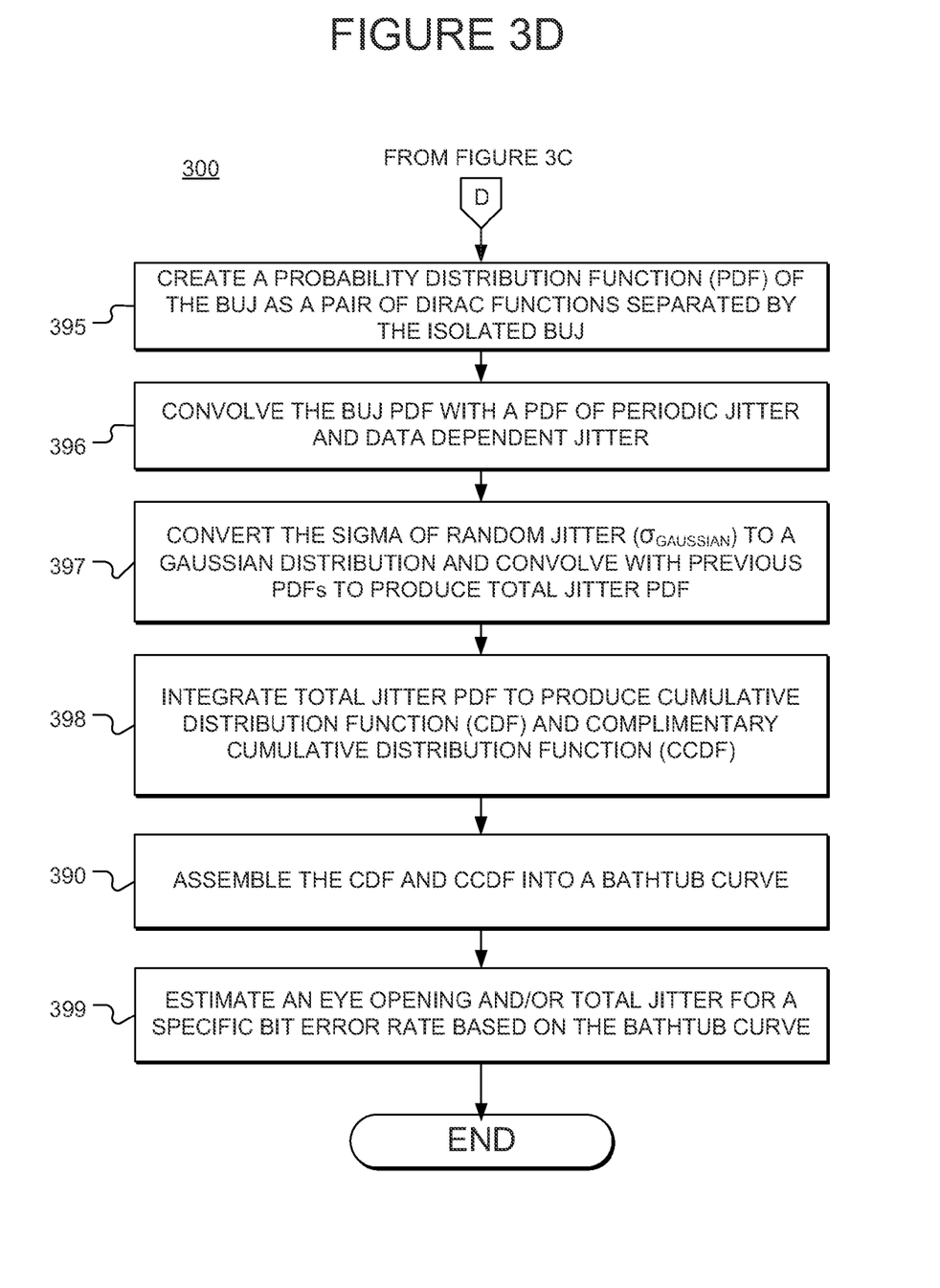

Thus, by first removing the non-random jitter that is recognizable using spectral and/or correlation steps described herein, the subsequent CDF analysis as illustrated in FIGS. 3C, 3D and 4C operates in a less cluttered environment, and is therefore able to perform the task more accurately. While the CDF analysis in Q-space is the preferred method disclosed herein, it should be understood that the estimated CDF of the uncorrelated residual jitter can be analyzed directly or using other suitable analysis techniques.

The flow then proceeds to FIG. 3D, where at 395, a PDF of the BUJ 260 is created, preferably as a pair of Dirac functions. The Dirac functions each have a weight of 0.5, are separated by the BUJ amplitude identified in 260, and are equally spaced about the origin, or otherwise equidistant from the origin. After decomposition of the jitter, the PDFs of the BUJ, the periodic jitter components, and the correlated jitter components (e.g., data-dependent jitter) are convolved at 396. At 397, the standard deviation $\sigma$ of the random jitter is converted to a Gaussian distribution and convolved with the previously mentioned PDFs to produce a total jitter PDF. The flow proceeds to 398, where a cumulative distribution function (CDF) and complimentary cumulative distribution function (CCDF) are generated by integrating the PDF of total jitter. At 390, the CDF and the CCDF are assembled into a bathtub curve. In other words, the CDF and CCDF correspond to or can otherwise be arranged as a bathtub curve. After creating the bathtub curve, an eye opening and/or total jitter for a specific bit error rate (BER) can be estimated based on the bathtub curve at step 399.

Referring to FIGS. 4A-4C, the horizontal axis of the Q-scale can represent time in the case of a jitter distribution, and voltage in the case of a noise distribution. The vertical axis represents the Q-value.

In FIG. 4A, purely Gaussian random jitter or noise is shown, plotted on the Q-scale. As is shown, it approximates a single straight line with slope of 1 divided by σ, where σ is the standard deviation of the Gaussian component. FIG. 4B illustrates the CDF of composite jitter or noise, which approximates straight lines at the two extremes, but deviates in the central portion in a complex way, due to both correlated and uncorrelated jitter components. FIG. 4C, on the other hand, illustrates that if all jitter identifiable using the techniques described above are first removed, and the remaining residual jitter CDF is plotted on the Q-scale, only the BUJ components remain to be isolated. Hence, the decomposition or isolation of BUJ can be performed with greater accuracy and confidence. Furthermore, the RJ is more accurately determined, and as a result, the total jitter is also more accurately determined, which results in a more trustworthy and precise measurement of TJ@BER.

Although particular embodiments have been described, it will be appreciated that the principles of the invention are not limited to those embodiments. In some embodiments, an article comprises a non-transitory medium having associated instructions that, when executed, results in a test and measurement instrument performing the steps of the various embodiments of the invention as disclosed herein. Other variations and modifications may be made without departing from the principles of the invention as set forth in the following claims.

The invention claimed is:

1. A method for analyzing jitter using a test and measurement instrument, the method comprising:
   storing a data pattern associated with a waveform in an acquisition memory;
   identifying edge locations associated with the data pattern of the waveform;
   comparing the edge locations to a timing reference;
   obtaining a collection of time interval error values responsive to the comparison, the collection of time interval error values corresponding to a composite jitter of the waveform;
   decomposing the composite jitter into jitter components that are correlated to the data pattern and jitter components that are uncorrelated to the data pattern;
   using a spectral approach, decomposing the jitter components that are uncorrelated to the data pattern into jitter components that are recognizable as periodic and jitter components that are unrecognizable as periodic;
   converting the jitter components decomposed using the spectral approach to a time domain;
   subtracting from the composite jitter the jitter components that are correlated to the data pattern and the recognizably periodic jitter components, thereby isolating uncorrelated residual jitter; and
   decomposing the uncorrelated residual jitter into bounded uncorrelated jitter and random jitter, including:
      accumulating one or more data sets of uncorrelated residual jitter into a combined residual jitter;
      producing an estimated cumulative distribution function (CDF) curve of the combined residual jitter;
      examining the CDF curve of the combined residual jitter in Q-space; and
      isolating the bounded uncorrelated jitter based on the examination of the CDF curve of the combined residual jitter in Q-space, including:
         determining a first asymptote by performing a linear fit to a first portion of the CDF curve of the combined residual jitter in Q-space;
         determining a slope of the first asymptote;
         projecting the first asymptote in accordance with the determined slope until it intersects Q=0 axis at an intercept $J_L$;
         determining a second asymptote by performing a linear fit to a second portion of the CDF curve of the combined residual jitter in Q-space;
         determining a slope of the second asymptote;
         projecting the second asymptote in accordance with the determined slope until it intersects Q=0 axis at an intercept $J_R$;
         isolating the bounded uncorrelated jitter based on a comparison of $J_L$ and $J_R$.

2. The method of claim 1, wherein using the spectral approach includes decomposing the jitter components using one or more Discrete Fourier Transform calculations, into the jitter components that are recognizable as periodic and the jitter components that are unrecognizable as periodic.

3. The method of claim 1, wherein using the spectral approach includes decomposing the jitter components using one or more Fast Fourier Transform calculations, into the jitter components that are recognizable as periodic and the jitter components that are unrecognizable as periodic.

4. The method of claim 1, wherein isolating the bounded uncorrelated jitter further comprises:
   comparing $J_L$ with $J_R$; and
   when $J_L$ is less than $J_R$, isolating the bounded uncorrelated jitter to $J_R$ minus $J_L$ ($J_R-J_L$).

5. The method of claim 1, wherein isolating the bounded uncorrelated jitter further comprises:
   comparing $J_L$ with $J_R$; and
   when $J_L$ is greater than or equal to $J_R$, determining that the bounded uncorrelated jitter is zero.

6. The method of claim 1, wherein:
   the slope of the first asymptote is 1 divided by $\sigma_L$ ($1/\sigma_L$);
   the slope of the second asymptote is 1 divided by $\sigma_R$ ($1/\sigma_R$); and
   when $J_L$ is less than $J_R$, determining the standard deviation σ of the random jitter as $(\sigma_L+\sigma_R)$ divided by 2 (($\sigma_L+\sigma_R$)/2).

7. The method of claim 1, wherein decomposing the composite jitter into correlated jitter components and uncorrelated jitter components further includes:
   correlating at least portions of the data pattern with deterministic jitter characteristics so that data-dependent jitter can be identified.

8. The method of claim 1, wherein decomposing the composite jitter into correlated jitter components and uncorrelated jitter components further includes:
   performing spectral analysis of the waveform to further identify deterministic jitter components of the waveform.

9. The method of claim 1, wherein decomposing the uncorrelated residual jitter into bounded uncorrelated jitter and random jitter further includes isolating the bounded uncorrelated jitter based on an examination of the uncorrelated residual jitter in Q-space.

10. The method of claim 1, further comprising:
    creating a probability density function (PDF) of the bounded uncorrelated jitter as a pair of Dirac functions, each Dirac function having a weight of 0.5, and separated by the bounded uncorrelated jitter amplitude such that they are equidistant from an origin;
    converting the standard deviation σ of the random jitter to a Gaussian distribution;
    after decomposition of the jitter, convolving PDFs of the bounded uncorrelated jitter, the periodic jitter components, the correlated jitter components, and the Gaussian distribution of the random jitter, to obtain an estimated PDF of total jitter; and generating a cumulative distribution function (CDF) and complimentary cumulative distribution function (CCDF) by integrating the PDF of total jitter.

11. The method of claim 10, wherein the CDF and CCDF correspond to a bathtub curve, the method further comprising:
estimating at least one of (a) an eye opening and (b) total jitter, for a specific bit error rate based on the bathtub curve.

12. The method of claim 1, wherein isolating the bounded uncorrelated jitter based on the examination of the CDF curve of the combined residual jitter in Q-space further includes isolating the random jitter based on the determined slope of the first asymptote and the determined slope of the second asymptote.

13. A test and measurement instrument, comprising:
an input to receive a waveform;
acquisition memory coupled to the input and configured to store a data pattern associated with the waveform and to accumulate one or more data sets of uncorrelated residual jitter into a combined residual jitter; and
a controller coupled to the acquisition memory and operable to compare edge locations of the data pattern to a timing reference, to obtain a collection of time interval error values, in which the time interval error values correspond to a composite jitter of the waveform, wherein:
the controller includes a jitter decomposition circuit to decompose the composite jitter into jitter components that are correlated to the data pattern and jitter components that are uncorrelated to the data pattern;
the jitter decomposition circuit is further configured to:
decompose the jitter components that are uncorrelated to the data pattern, using a spectral approach, into jitter components that are recognizable as periodic and jitter components that are unrecognizable as periodic;
convert the jitter components to a time domain;
subtract from the composite jitter the jitter components that are correlated to the data pattern and the recognizably periodic jitter components, thereby isolating the uncorrelated residual jitter;
decompose the uncorrelated residual jitter into bounded uncorrelated jitter and random jitter;
produce an estimated cumulative distribution function (CDF) curve of the combined residual jitter, examine the CDF curve of the combined residual jitter in Q-space, and isolate the bounded uncorrelated jitter based on the examination;
determine a first asymptote by performing a linear fit to a first portion of the CDF curve of the combined residual jitter in Q-space;
determine a slope of the first asymptote;
project the first asymptote in accordance with the determined slope until it intersects Q=0 axis at an intercept $J_L$;
determine a second asymptote by performing a linear fit to a second portion of the CDF curve of the combined residual jitter in Q-space;
determine a slope of the second asymptote;
project the second asymptote in accordance with the determined slope until it intersects Q=0 axis at an intercept $J_R$;
isolate the bounded uncorrelated jitter based on a comparison of $J_L$ and $J_R$.

14. The test and measurement instrument of claim 13, wherein the jitter decomposition circuit is further configured to compare $J_L$ with $J_R$, and isolate the bounded uncorrelated jitter to $J_R-J_L$ responsive to $J_L$ being less than $J_R$.

15. The test and measurement instrument of claim 13, wherein the jitter decomposition circuit is further configured to compare $J_L$ with $J_R$, and determine that the bounded uncorrelated jitter is zero responsive to $J_L$ being greater than or equal to $J_R$.

16. The test and measurement instrument of claim 13, wherein:
the slope of the first asymptote is 1 divided by $\sigma_L$ ($1/\sigma_L$);
the slope of the second asymptote is 1 divided by $\sigma_R$ ($1/\sigma_R$); and
the decomposition circuit is further configured to determine the standard deviation σ of the random jitter as ($\sigma_L+\sigma_R$) divided by 2 (($\sigma_L+\sigma_R$)/2) responsive to $J_L$ being less than $J_R$.

17. The test and measurement instrument of claim 13, wherein the decomposition circuit is further configured to isolate the bounded uncorrelated jitter based on an examination of the residual jitter in Q-space.

18. The test and measurement instrument of claim 13, wherein the jitter decomposition module is further configured to isolate the random jitter based on the determined slope of the first asymptote and the determined slope of the second asymptote.

19. A method for analyzing noise using a test and measurement instrument, the method comprising:
determining a composite noise that is present within a data pattern of a waveform;
decomposing the composite noise into noise that is correlated to the data pattern and noise that is uncorrelated to the data pattern;
using a spectral approach, decomposing the noise that is uncorrelated to the data pattern into noise that is recognizable as periodic and noise that is unrecognizable as periodic;
subtracting from the composite noise the noise that is correlated to the data pattern and the recognizably periodic noise, thereby isolating uncorrelated residual noise; and
decomposing the uncorrelated residual noise into bounded uncorrelated noise and random noise, including:
accumulating one or more data sets of uncorrelated residual noise into a combined residual noise;
producing an estimated cumulative distribution function (CDF) curve of the combined residual noise;
examining the CDF curve of the combined residual noise in Q-space; and
isolating the bounded uncorrelated noise based on the examination of the CDF curve of the combined residual noise in Q-space, including:
determining a first asymptote by performing a linear fit to a first portion of the CDF curve of the combined residual noise in Q-space;
determining a slope of the first asymptote;
projecting the first asymptote in accordance with the determined slope until it intersects Q=0 axis at an intercept $J_L$; determining a second asymptote by performing a linear fit to a second portion of the CDF curve of the combined residual noise in Q-space;
determining a slope of the second asymptote;
projecting the second asymptote in accordance with the determined slope until it intersects Q=0 axis at an intercept $J_R$;

isolating the bounded uncorrelated noise based on a comparison of $J_L$ and $J_R$.

20. The method of claim 19, wherein isolating the bounded uncorrelated jitter based on the examination of the CDF curve of the combined residual jitter in Q-space further includes isolating the random jitter based on the determined slope of the first asymptote and the determined slope of the second asymptote.

21. An article comprising a machine-accessible non-transitory medium having associated instructions that, when executed, results in a machine performing the steps of claim 1.

22. A method for analyzing jitter using a test and measurement instrument, the method comprising:
   storing a data pattern associated with a waveform in an acquisition memory;
   identifying edge locations associated with the data pattern of the waveform;
   comparing the edge locations to a timing reference;
   obtaining a collection of time interval error values responsive to the comparison, the collection of time interval error values corresponding to a composite jitter of the waveform;
   using a spectral approach, decomposing the composite jitter into jitter components that are recognizable as periodic and jitter components that are unrecognizable as periodic;
   converting the jitter components to a time domain;
   producing a histogram of uncorrelated residual jitter based on the jitter components;
   accumulating one or more data sets of uncorrelated residual jitter into a combined residual jitter; and
   decomposing the combined residual jitter into bounded uncorrelated jitter and random jitter, including:
      producing an estimated cumulative distribution function (CDF) curve of the combined residual jitter;
      examining the CDF curve of the combined residual jitter in Q-space; and
      isolating the bounded uncorrelated jitter based on the examination of the CDF curve of the combined residual jitter in Q-space, including:
         determining a first asymptote by performing a linear fit to a first portion of the CDF curve of the combined residual jitter in Q-space;
         determining a slope of the first asymptote;
         projecting the first asymptote in accordance with the determined slope until it intersects Q=0 axis at an intercept $J_L$;
         determining a second asymptote by performing a linear fit to a second portion of the CDF curve of the combined residual jitter in Q-space;
         determining a slope of the second asymptote;
         projecting the second asymptote in accordance with the determined slope until it intersects Q=0 axis at an intercept $J_R$;
         isolating the bounded uncorrelated jitter based on a comparison of $J_L$ and $J_R$.

23. The method of claim 22, wherein using the spectral approach includes decomposing the jitter components using one or more Discrete Fourier Transform calculations, into the jitter components that are recognizable as periodic and the jitter components that are unrecognizable as periodic.

24. The method of claim 22, wherein using the spectral approach includes decomposing the jitter components using one or more Fast Fourier Transform calculations, into the jitter components that are recognizable as periodic and the jitter components that are unrecognizable as periodic.

25. The method of claim 22, wherein isolating the bounded uncorrelated jitter further comprises:
   comparing $J_L$ with $J_R$; and
   when $J_L$ is less than $J_R$, isolating the bounded uncorrelated jitter to $J_R$ minus $J_L$ ($J_R - J_L$).

26. The method of claim 22, wherein isolating the bounded uncorrelated jitter further comprises:
   comparing $J_L$ with $J_R$; and
   when $J_L$ is greater than or equal to $J_R$, determining that the bounded uncorrelated jitter is zero.

27. The method of claim 22, wherein:
   the slope of the first asymptote is 1 divided by $\sigma_L$ ($1/\sigma_L$);
   the slope of the second asymptote is 1 divided by $\sigma_R$ ($1/\sigma_R$); and
   when $J_L$ is less than $J_R$, determining the standard deviation $\sigma$ of the random jitter as ($\sigma_L + \sigma_R$) divided by 2 (($\sigma_L + \sigma_R$)/2).

28. The method of claim 22, wherein isolating the bounded uncorrelated jitter based on the examination of the CDF curve of the combined residual jitter in Q-space further includes isolating the random jitter based on the determined slope of the first asymptote and the determined slope of the second asymptote.

* * * * *